United States Patent [19]

Liu et al.

[11] Patent Number: 4,923,521
[45] Date of Patent: May 8, 1990

[54] METHOD AND APPARATUS FOR REMOVING SOLDER

[75] Inventors: Jay J. Liu, Somerville; Y. H. Wong, Summit, both of N.J.

[73] Assignee: American Telephone and Telegraph Company, New York, N.Y.

[21] Appl. No.: 255,896

[22] Filed: Oct. 11, 1988

[51] Int. Cl.$^5$ .................. B08B 7/00; B23K 31/02
[52] U.S. Cl. ........................... 134/5; 228/119; 228/124
[58] Field of Search ............... 134/1, 5, 19; 228/119, 228/180.2, 254, 124; 428/628; 437/923

[56] References Cited

U.S. PATENT DOCUMENTS 3,751,799  8/1973  Reynolds ........................... 228/119
4,323,631  4/1982  Spirig ................................. 228/19

FOREIGN PATENT DOCUMENTS 40669    12/1981  European Pat. Off. .
0162465  12/1979  Japan ................................. 228/119
0206234   9/1986  Japan ................................. 437/923

OTHER PUBLICATIONS

"IBM Technical Disclosure Bulletin", vol. 27, No. 9, Feb. 1985.
Karl J. Puttlitz, "Flip-Chip Replacement Within the Constraints Imposed by Multilayer Ceramic (MLC) Modules," *Journal of Electronic Materials*, vol. 13, No. 1, pp. 29-46, 1984.
Kenneth E. Bean, "Anisotropic Etching of Silicon," *IEEE Transactions on Electron Devices*, vol ED-25, No. 10, pp. 1185-1193, Oct., 1978.

Primary Examiner—Asok Pal
Assistant Examiner—Ourmazd Ojan
Attorney, Agent, or Firm—R. B. Anderson

[57] ABSTRACT

In a process for repairing electronic device packages, the problem of removing solder remnants on substrate bonding pads is solved by, first, etching a pattern in silicon and metallizing the pattern to make a silicon wick. The solder remnants on the bonding pads are melted, and the etched pattern of the silicon wick is brought into contact with the remnants to remove them by capillary action. It is often convenient to heat the silicon wick so that solder remnants melt when the wick is brought into contact with them.

16 Claims, 2 Drawing Sheets

METHOD AND APPARATUS FOR REMOVING SOLDER

TECHNICAL FIELD

This invention relates to processes for fabricating electronic devices, and, more particularly, to methods for removing solder remnants as are required in such processes.

BACKGROUND OF THE INVENTION

Electronic circuit systems are typically made by defining complex integrated circuit structures on semiconductor chips, bonding the chips to circuit package substrates, and in turn bonding the packages to printed circuit boards. For such structural bonding, increasing use is being made of "flip-chip" technology in which an element such as a circuit chip is soldered directly to the surface of a substrate rather than being supported by a wire or post affixed to the substrate. A plurality of solder "bumps" are formed on the semiconductor chip, and the chip is aligned on the substrate with each solder bump placed on a metal bonding pad. The unit is then heated so as to melt (reflow) the solder so that when the solder hardens, the chip is bonded to the substrate bonding pads. The same method is often used for surface mounting circuit packages to a printed circuit board.

When the device package comprises a ceramic substrate upon which a complex circuit has been defined which makes connection with several circuit chips mounted on the substrate, the result is usually preferred to as a hybrid integrated circuit (HIC). Increasingly, more complex circuits have been defined in integrated circuit chips, leading to a new technology known as very large scale integration (VLSI). To accommodate such complexity, there has arisen a demand for more complex circuitry on the substrate than can be conveniently made on a ceramic substrate. To meet these demands, workers have developed silicon substrates upon which denser circuit patterns can be formed and within which two or more levels of conductors can be formed. Circuit packages of this type are still generally in the developmental stage and are known as advanced VLSI packaging (AVP).

Each AVP package comprises many chips connected to a substrate to form a complex system or subsystem. As a consequence, after the circuit package has been assembled, it is frequently found that one of the chips must be removed for repair or replacement. This can be done by either shearing or melting the solder bonds, removing the chip, and then rebonding a replaced or repaired chip using surface mount techniques as described previously. Such removal also requires removal of the solder remnants left on the bonding pads after removal of the chip. In conventional HIC technology or printed wiring board technology, this can be done by melting the remanants and removing them with vacuum suction. However, when the substrate bonding pads become extremely small, as is characteristic of AVP, it has been found that conventional vacuum suction solder removal often results in splashing of the molten solder onto the substrate and other inconsistencies in the solder removal. We have also tried various techniques for sponging the molten solder from the bonding pads such as using very fine gold-plated copper mesh as a wicking element and using copper powder cakes as a wicking element to soak up the molten solder by capillary action. These devices and techniques have been satisfactory because they provide a non-uniform and generally unreliable wicking action across the surface of the substrate.

SUMMARY OF THE INVENTION

In a process for repairing electronic device packages, the problem of removing solder remnants on substrate bonding pads is solved by, first, etching a pattern in silicon and metallizing the pattern to make a silicon wick. The solder remnants on the bonding pads are melted and the etched pattern of the silicon wick is brought into contact with the remnants to remove them by capillary action. It is often convenient to heat the silicon wick so that solder remnants melt when the wick is brought into contact with them.

These and other objects, features, and advantages of the invention will be better understood from a consideration of the following detailed description taken in conjunction with the accompanying drawing.

DETAILED DESCRIPTION

As briefly described above, the present invention is an improvement in a process for making and repairing electronic device packages each including an electronic chip soldered to bonding pads of a substrate. Such chips are soldered to bonding pads by first bonding small solder elements or "bumps" to the chip, placing the chip on the substrate such that each bump lies on a corresponding bonding pad of the substrate, and heating the assembly to cause the solder to melt or "reflow". When the solder subsequently hardens, it bonds the electronic chip to the substrate. This form of bonding is known in the art variously as "flip-chip" technology or "surface mount" technology. The term "surface mount" is used more commonly when the substrate is a printed wiring board and implies an absence of holes in the substrate for mounting the chip or packaged device; the term "flip-chip" is more commonly used when the substrate and the chip together constitute a hydrid integrated circuit.

Figure 3:
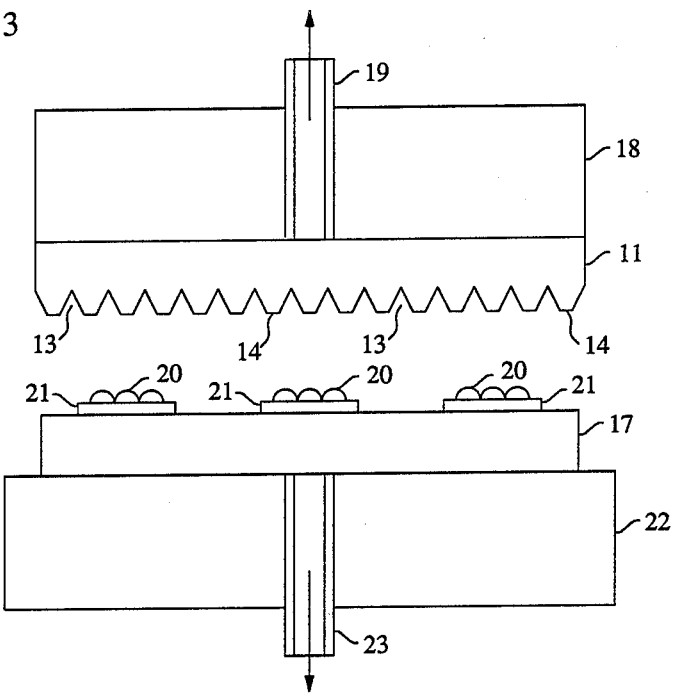
FIG. 3 is a view of apparatus for removing silicon remnants in accordance with one embodiment of the invention.

Especially in modern hybrid integrated circuits and advanced VLSI packaging (AVP), circuit patterns on the substrate combine with those on mounted chips to perform the desired electronic functions. Thus, complete testing of the device can only occur after the component chips have been mounted on the substrate. A routine part of such assembly and testing requires that defective chips be removed from the substrate, and this can be done either by physically shearing the solder bonds or applying enough heat to melt the bonds. After removal of a defective chip, a replacement chip is normally provided and is solder bonded as described above. With circuit elements extremely small, as is characteristic of AVP, it is important that, when a chip is removed, remnant solder on the substrate bonding pads either be completely removed, or that a precisely controlled amount of remnant solder be retained on the bonding pads. In accordance with our invention, the problem of removing remnant solder is solved by, first, providing a solder wick element as shown in FIG. 1 and then using the wick element to soak up the molten solder remnants as shown in FIG. 3.

Figure 1:
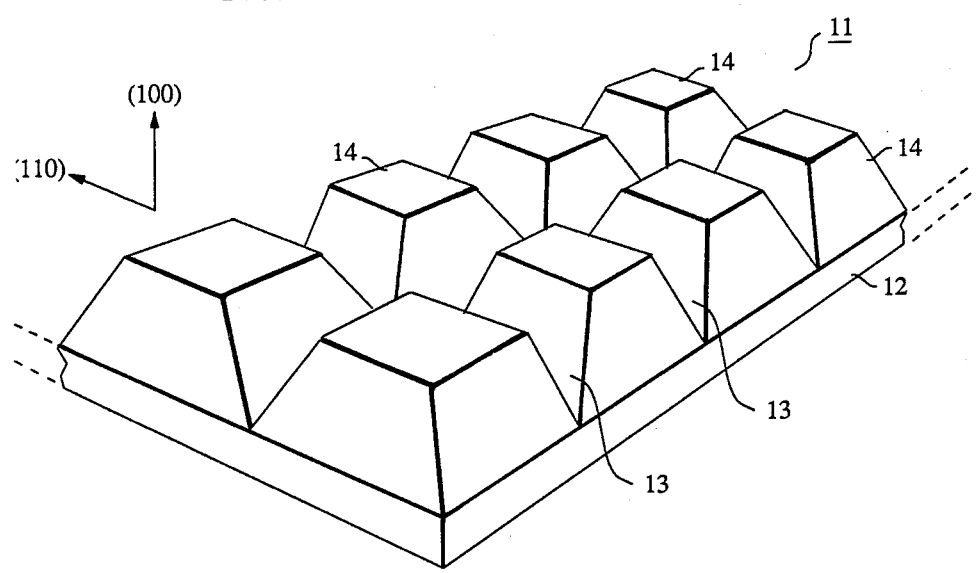
FIG. 1 is a perspective view of part of a silicon wick made in accordance with one aspect of the invention.

The wick element 11 of FIG. 1 is formed from a monocorystalline silicon chip 12 by using known principles of photolithographic masking and anisotropic etching. A grid of grooves 13 is etched in the silicon chip so as to define an array of mesa element 14. The grooves 13 may extend one mil into the chip, and the mesas may have two mil center-to-center spacings. Thereafter, the mesas 14 are metallized so as to be "wettable" with molten solder. Thus, when the mesa 14 contact the molten solder, capillary action drives the solder to flow into the grooves 13 and thus wick or "sponge" the solder from the bonding pads. The chemical etching of monocrystalline silicon is highly dependent on the crystal orientation of the silicon, as is well-known in the art, and is discussed in detail for example, in the paper "Anisotropic Etching of SIlicon," by K. E. Bean, *IEEE Transactions on Electron Devices.* Vol. ED-25, No. 10, Oct. 1978, pp. 1185-1193.

Figure 2:
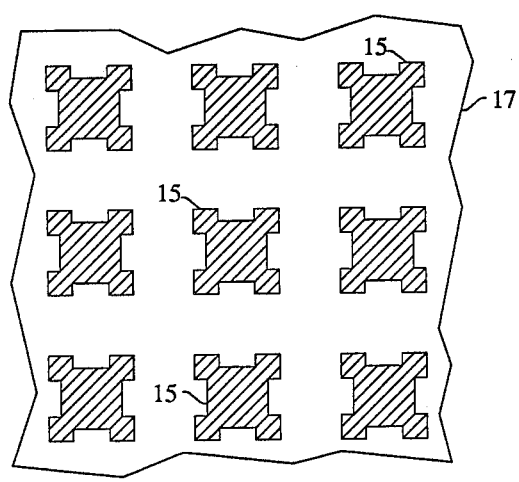
FIG. 2 is an illustration of a mask pattern used in the fabrication of the apparatus of FIG. 1.

In one illustrative embodiment, single crystal (100) oriented silicon wafers with a 4,000 angstrom thick oxide layer were used, the <100> and <110> crytallographic directions being shown by the arrows on FIG. 1. The surface of the chip was covered with a photoresist, and a photolithographic mask pattern as shown in FIG. 2 was used to expose the photoresist layer. Each of the elements 15 of the mask may constitute either a transparent portion on an opaque mask or opaque portions on a transparent mask as is known in the art. The center-to-cener spacing of elements 15 was two mils for the purpose of generating the two mil spacings for the mesas.

Rather than being in the shape of simple square, each element 15 provided extra masking at each of the four corners to compensate for faster etching in the {331}plane than in the {111}crystallographic plane of the silicon chip 12. One side of the mask pattern was aligned parallel to the (110) flat of the chip. The elements 15 were opaque so that the remaining area 17 exposed the photoresist layer to actinic light. The exposed photoresist was removed by developing to expose part of the silicon dioxide. The exposed portions of the silicon dioxide were then etched using buffered HF, which resulted in a 4,000 angstrom thick SiO$_2$ mask of patterns corresponding to those of FIG. 2. Afterwards, the exposed silicon was etched using a known ethylene diamine pyrocatechol (EDP) solution at 100° C. for 40 minutes, which etched the one mil deep grooves 13 in the silicon chip 12. The remaining oxide on the top of the mesas was next removed using a buffered HF solution. Thereafter, a thin metal film 500 angstroms thick of chromium was deposited on the silicon wick surface, and a film 5000 angstroms thick of gold was deposited over the chromium, both by sputtering. The gold film provides an excellent wetting surface to molten solder, while the chromium serves as an adherent between the silicon and gold. Other metallization systems may be used as is known in the art; e.g. gold-copper-chromuim layers, and gold-platinum-titanium layers.

There are a number of advantages to making a wicking element in this manner. First, elements such as shown in FIG. 1 can be made inexpensively and with great reproducibility. Because the surfaces involved are defined by crystallographic planes, the dimensions and spacing of the structures shown in FIG. 1 are ordered and consistent to within exceedingly small tolerances. Photolithographic masking, etching, and metal deposition on silicon are well-developed technologies and easily implemented. Silicon is a rigid material so that a relatively large area wick can be formed that retains its planarity without, for example, any sag or other departure from planarity. Finally, at least with gold metallization, no solder flux is required for the wicking operation, which is not necessarily true for alternative techniques.

Referring to FIG. 3, the wick element 11 is preferably made so as to have roughly the same dimensions as a substrate chip site 17 from which solder remnants are to be removed. Thus, in the embodiment shown schematically in FIG. 3, the silicon wick 11 and silicon integrated circuit chip or chip site 17 are each approximately one centimeter square. One can appreciate that it is important that the wick element be made of a material that retains its planarity in view of the fact that the grooves 13 are only one mil (25 microns) deep. Thus, the ratio of groove depth (or mesa height) to length or width of the silicon wick 11 is illustratively 0.0025:1. It is apparent that, for the sake of clarity, the schematic drawing of FIG. 3 does not show the component elements in accurate relative proportion.

In the FIG. 3 apparatus, the wick element 11 was held to an upper thermode 18 by a vacuum formed in tubulation 19. The solder remnants 20 located on bonding pads 21 of the substrate 17 were 60 percent tin and 40 percent lead. The substrate 17 was supported on a lower thermode 22 by a vacuum formed in tubulation 23. The lower thermode was heated to 150° C., which preheats the remnants; and the upper thermode was heated to 250° C. The upper thermode 18 was part of a robot that controlled the wick element 11 to touch the solder remnants 20, to melt them, and cause the molten solder to be drawn into the wick element 11 by capillary action. Experiments showed that sholder remnants on each pad 20 had an original dimensionn of about 4.8 mils square which spread to 12 mils square on the wicking element. Thus, the capillary action is effective for drawing the remnant solder vertically and spreading it horizontally.

In other experiments, 95 percent lead and 5 percent tin solder was used. The lower thermode was heated to 290° C., the upper thermode to 370° C., and the solder spread on the wick element was 40 mils square.

Figure 4:
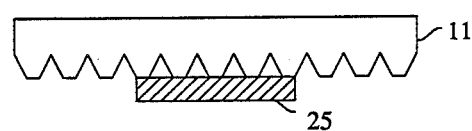
FIGS. 4-6 schematic views of silicon wick elements in accordance with various alternative embodiments of the invention.
Figure 5:
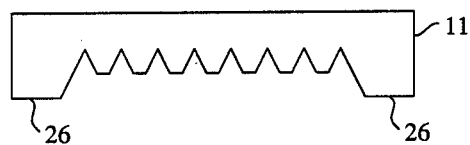
Figure 6:
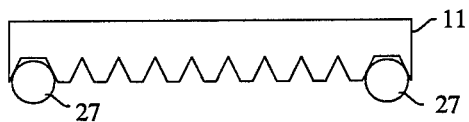

It has been found that if the wicking element 11 is brought down with force onto the bonding pads 21, liquid solder can be splashed or smeared out from the bonding pads. Because of spreading of solder on the wick surface, the wick element may actually transfer the solder to the substrate if it makes contact to the substrate. Because the thickness of chip substrate 17 can be variable, it is sometimes difficult to control the robot so that the wicking element does not physically contact the bonding pads 21. FIGS. 4, 5, and 6 show different standoff structures that can be incorporated as part of the wick element 11 to separate the wick surface by a controlled distance from the surfaces of the bonding pads.

In FIG. 4, a film 25, which may be one mil thick, separates the wick surface from the bonding pad surfaces. The film 25 is shown as being mounted in the central portion of wick 11, which is preferred if the bonding pads are all located around the periphery of the chip, as is often the case. The robot will then compress the film 25 against the upper surface of the substrate 17 and stop the wick element a small controlled distance from the upper surface of bonding pads 21. The film 25 may be of any of various forms of high temperature plastic which are somewhat compressible; it may be made, for example, of Kapton (a trademark of the Dupont Company).

In FIG. 5 a central cavity is etched in the wick element so as to provide peripheral standoff regions 26. In FIG. 6 the standoff is conveniently made by bonding copper balls 27 of the appropriate diameter to the wick element 11. In any of these embodiments, the proper distancing of the wick element from the surface of the bonding pads can be used to leave a controlled amount of the solder on the bonding pad after solder wicking has taken place.

The various structures and process embodiments that have been shown are to be considered merely illustrative of the inventive concept. Substances such as germanium share many of the characteristics that make silicon work well as a wick element. The invention was stimulated by a need to remove remnant solder from bonding pads as small as 4.8 mils square, for which other methods proved inadequate, but we have no reason to think the procedure is not applicable to larger dimensions. It may be useful, for example, in removing molten solder from printed wiring board bonding pads. In time, we expect bonding pads to be one mil square or less, in which case use of our invention would appear necessary. Various other embodiments and modifications will be apparent to those skilled in the art without departing from the spirit and scope of the invention.

We claim:

1. A process for repairing electronic device packages each including an electronic chip soldered to bonding pads of a substrate, said process comprising the steps of:
    etching a pattern in silicon to make a silicon wick; removing the chip from the substrate, thereby leaving solder remnants on the bonding pads; melting the remnants; and bringing the etched pattern of the silicon wick into contact with the melted solder remnants, thereby to remove the solder remnants from the bonding pads by capillary action.

2. The process of claim 1 wherein:
    the chip is removed from the substrate by shearing solder bonds between the chip and the bonding pads, thereby leaving solid solder remnants on the bonding pads.

3. The process of claim 1 wherein:
    the process of removing the chip from the substrate comprises the steps of melting solder bonds between the chip and the substrate and then removing the chip from the substrate, thereby leaving molten solder remnants on the bonding pads.

4. The process of claim 1 wherein:
    the step of melting the remnants comprises the step of heating the silicon wick and bringing the heated wick into contact with the remnants, thereby to melt the remnants.

5. The process of claim 1 wherein:
    the step of bringing the silicon wick into contact with the remnants comprises the steps of including on the wick a standoff element that contacts the substrate to define a controlled gap between the silicon wick and the surface of the bonding pads.

6. The process of claim 5 wherein:
    the standoff is a plastic film mounted on the silicon wick surface opposite the substrate.

7. The process of claim 5 wherein:
    the standoff element comprises a plurality of metal balls mounted on the silicon wick surface opposite the substrate.

8. The process of claim 1 wherein:
    the silicon wick is monocrystalline silicon; and the pattern is defined by a grid pattern of grooves in the silicon.

9. The process of claim 1 wherein:
    the etching step comprises the step of photolithographic masking and etching a pattern of grooves in the silicon to define an array of mesa structures.

10. The process of claim 1 further comprising the step of:
    metallizing the pattern surface of the silicon wick.

11. The process of claim 10 wherein:
    the process of metallizing on the surface comprises the steps of successively sputtering layers of chromium and gold onto the silicon wick surface.

12. A process for removing solder remnants from a substrate surface comprising the steps of:
    etching a pattern of grooves in a monocrystalline element to form a wick surface; melting the solder remnants; and bringing the wick surface into contact with the melted solder remnants, thereby to remove the remnants by capillary action.

13. The process of claim 12 wherein:
    the monocrystalline element is silicon; and the wick surface is metallized prior to solder remnant removal.

14. The process of claim 13 wherein:
    the etching step comprises the step of photolithographic masking and etching a grid pattern of grooves in the silicon to define an array of mesa structures.

15. The process of claim 14 further comprising the step of:
    including on the monocrystalline element a standoff element that contacts the substrate surface when the wick surface is brought into contact with the remnants to define a controlled gap between the wick and the substrate surface.

16. The process of claim 15 further comprising the steps of:
    preheating the solder remnants by heating the substrate; and the melting step comprises the step of heating the monocrystalline element to a sufficiently high temperature as to melt the remnants when such monocrystalline element is brought into contact with such remnants.

* * * * *